(12) United States Patent
Zhang et al.

(10) Patent No.: US 7,397,089 B2
(45) Date of Patent: Jul. 8, 2008

(54) ESD PROTECTION STRUCTURE USING CONTACT-VIA CHAINS AS BALLAST RESISTORS

(75) Inventors: Jiong Zhang, Irvine, CA (US); Yuhua Cheng, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 11/201,638

(22) Filed: Aug. 10, 2005

(65) Prior Publication Data

US 2007/0034960 A1 Feb. 15, 2007

(51) Int. Cl.
*H01L 23/62* (2006.01)

(52) U.S. Cl. ...................... 257/360; 257/355

(58) Field of Classification Search .................. 257/355, 257/358, 363, 360
See application file for complete search history.

(56) References Cited

U.S. PATENT DOCUMENTS 6,034,433 A * 3/2000 Beatty ........................ 257/758
6,898,062 B2 5/2005 Russ et al.
2001/0045670 A1* 11/2001 Nojiri ......................... 257/786

* cited by examiner

*Primary Examiner*—Douglas M Menz
(74) *Attorney, Agent, or Firm*—Farjami & Farjami LLP

(57) ABSTRACT

According to an exemplary embodiment, an ESD protection structure situated in a semiconductor die includes a FET including a gate and first and second active regions, where the gate includes at least one gate finger, and where the at least one gate finger is situated between the first and second active regions. The ESD protection structure further includes at least one contact-via chain connected to the first active region, where the at least one contact-via chain includes a contact connected to a via. The at least one contact-via chain forms a ballast resistor for increased ESD current distribution uniformity. The contact is connected to the via by a first metal segment situated in a first interconnect metal layer of a die. The at least one contact-via chain is connected between the first active region and a second metal segment situated in a second interconnect metal layer of the die.

19 Claims, 2 Drawing Sheets

ESD PROTECTION STRUCTURE USING CONTACT-VIA CHAINS AS BALLAST RESISTORS

BACKGROUND OF THE INVENTION

1. Field of the Invention

The present invention is generally in the field of semiconductors. More particularly, the invention is in the field of ESD protection structures in semiconductor dies.

2. Background Art

"Multi-finger" FETs, such as multi-finger MOSFETs, are used as a major electrostatic discharge (ESD) component in many CMOS applications. In order to discharge ESD current uniformly, a multi-finger FET should be designed such that all portions of the multi-finger FET turn on simultaneously. However, due to process variations and a continual scaling down of device size in advanced technologies, it is difficult for all portions of a multi-finger FET to conduct ESD current uniformly. Thus, a portion of the multi-finger FET may turn on faster than another portion of the multi-finger FET and become "a hot-spot," which can localize more ESD current. By localizing more ESD current, the hot-spot can cause early ESD failure in the form of filamentation or thermal runaway.

To avoid the creation of a hot-spot in an ESD structure, a ballast resistor has been connected in series with a drain and/or source of the multi-finger FET to assist in uniformly distributing ESD current. In one conventional approach, a salicide block layer is added on the active region between drain contact and gate edge of a multi-finger FET such that an unsalicided active region operates as a local ballast resistor. However, this approach requires a large layout area and introduces a high drain-to-bulk parasitic capacitance, which severely degrades device high frequency performance.

In another conventional approach, a ballast resistor can be formed by connecting an N well resistor in series with a drain of a multi-finger FET. However, the N well resistor also requires a large layout area and undesirably introduces high parasitic N well-to-bulk capacitance to the drain, thereby severely degrading device high frequency performance.

In yet another conventional approach, a number of segmented active strips are used on both drain and source sides of the gate of a multi-finger FET such that each segmented active strip provides an equivalent local ballast resistor. However, in this approach, an increase in ballast resistance requires a corresponding increase in the length of each segmented active strip, which undesirable increases layout area. By increasing the layout area, drain-to-bulk and/or source-to-bulk parasitic capacitance is also increased, which degrades high frequency performance of the device.

Thus, there is a need in the art for an ESD protection structure that provides increased ESD current distribution uniformity without undesirably increasing layout area, and without degrading high frequency performance.

SUMMARY OF THE INVENTION

The present invention is directed to an ESD protection structure using contact-via chains as ballast resistors. The present invention addresses and resolves the need in the art for an ESD protection structure that provides increased ESD current distribution uniformity without undesirably increasing layout area, and without degrading high frequency performance.

According to an exemplary embodiment, an ESD protection structure situated in a semiconductor die includes a FET including a gate, a first active region, and a second active region, where the gate includes at least one gate finger, and where the at least one gate finger is situated between the first active region and the second active region. The first active region can be a drain active region or a source active region, for example. The ESD protection structure further includes at least one contact-via chain connected to the first active region, where the at least one contact-via chain includes a contact connected to a via. The at least one contact-via chain forms a ballast resistor for increased ESD current distribution uniformity. The via can be situated over and in approximate alignment with the contact, for example. The at least one contact-via chain may have a resistance of approximately 10.0 ohms, for example.

According to this exemplary embodiment, the contact is connected to the via by a first metal segment, where the first metal segment is situated in a first interconnect metal layer of the semiconductor die. The at least one contact-via chain is connected between the first active region and a second metal segment, where the second metal segment is situated in a second interconnect metal layer of the semiconductor die. The at least one contact-via chain may include a number of contact-via chains, where each of the contact-via chains is connected between the first active region and the second metal segment, for example. Other features and advantages of the present invention will become more readily apparent to those of ordinary skill in the art after reviewing the following detailed description and accompanying drawings.

DETAILED DESCRIPTION OF THE INVENTION

The present invention is directed to an ESD protection structure using contact-via chains as ballast resistors. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1A:
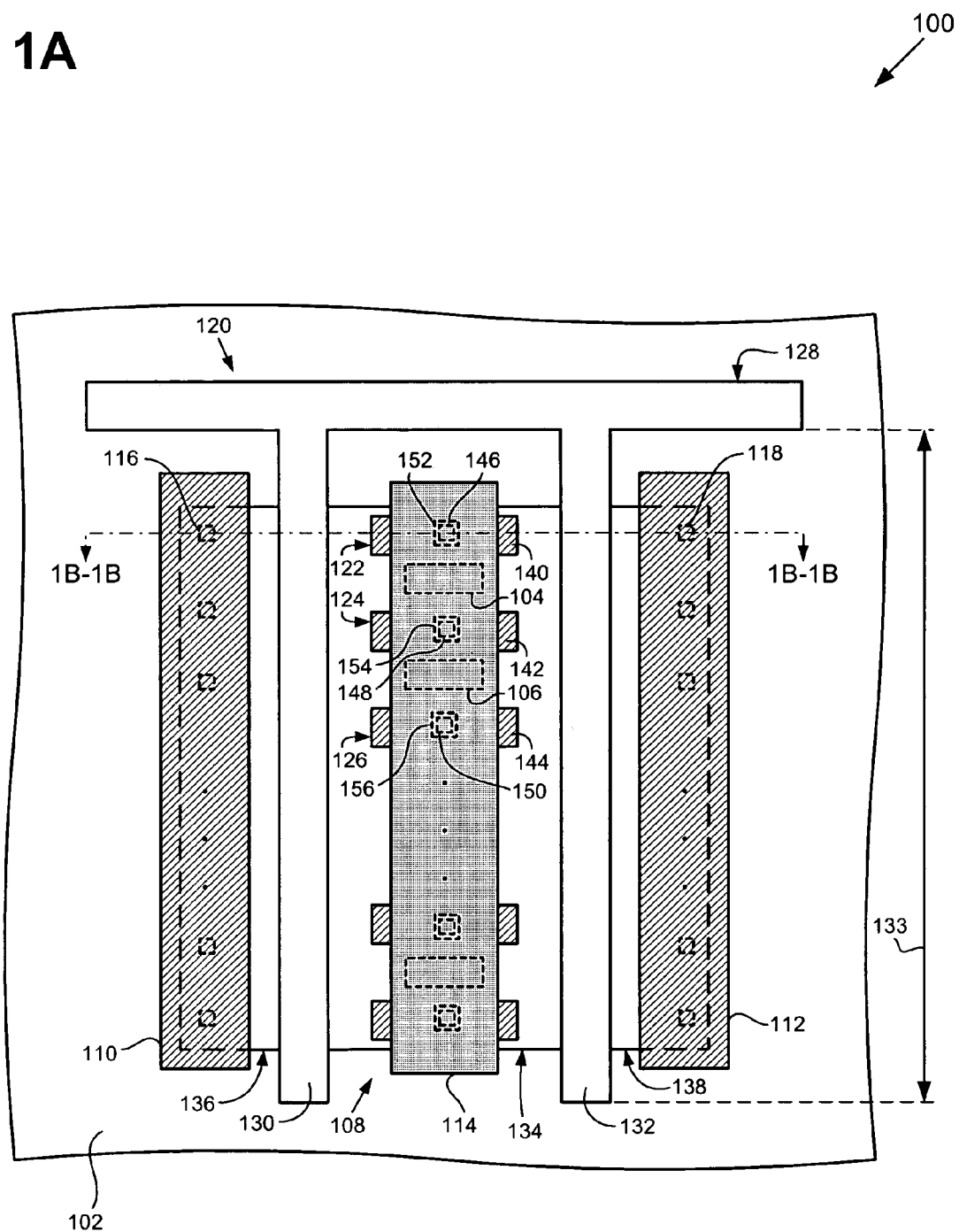
FIG. 1A illustrates a top view of an exemplary structure including an exemplary ESD protection structure in accordance with one embodiment of the present invention.

FIG. 1A shows a top view of a portion of a semiconductor die including an exemplary ESD protection structure in accordance with one embodiment of the present invention. Certain details and features have been left out of FIG. 1A, which are apparent to a person of ordinary skill in the art. As shown in FIG. 1A, structure 100 includes substrate 102, isolation regions 104 and 106, ESD protection structure 108, metal segments 110, 112, and 114, and contacts 116 and 118. ESD protection structure 108 further includes FET 120 and contact-via chains 122, 124, and 126. FET 120 further includes gate 128, which includes gate fingers 130 and 132, drain active region 134, and source active regions 136.

Also shown in FIG. 1A, contact-via chains 122, 124, and 126 further include metal segments 140, 142, and 144, contacts 146, 148, and 150, and vias 152, 154, and 156, respectively. In the present embodiment, FET 120 can be an N-channel FET (NFET). In another embodiment, FET 120 can be a P-channel FET (PFET). In the present embodiment, FET 120 has two gate fingers. In other embodiments, FET 120 can be a multi-finger NFET or a multi-finger PFET having more than two gate fingers. In another embodiment, FET 120 can be a single-finger NFET or a single-finger PFET. It is noted that that only contacts 116, 118, 146, 148, and 150, contact-via chains 122, 124, and 126, metal segments 140, 142, and 144, and vias 152, 154, and 156 are specifically discussed in the present application to preserve brevity.

Also shown in FIG. 1A, gate fingers 130 and 132 of gate 128 are situated over substrate 102. In the present embodiment, gate fingers 130 and 132 can comprise polycrystalline silicon (polysilicon). In other embodiments, gate fingers 130 and 132 may comprise metal or other appropriate conductive material. Gate fingers 130 and 132 have width 133, which can be approximately 20.0 microns, for example. However, width 133 of gate fingers 130 and 132 may also be less than or greater than 20.0 microns. Further shown in FIG. 1A, drain active region 134 is situated in substrate 102 between gate fingers 130 and 132. In the present embodiment, drain active region 134 can comprise silicon that is heavily doped with an N type dopant. In an embodiment in which FET 120 is a PFET, drain active region 134 can comprise silicon that is heavily doped with a P type dopant.

Also shown in FIG. 1A, source active regions 136 and 138 are situated in substrate 102 adjacent to respective fingers 130 and 132 of gate 128. In the present embodiment, source active regions 136 and 138 can comprise silicon that is heavily doped with an N type dopant. In an embodiment in which FET 120 is a PFET, source active regions 136 and 138 can comprise silicon that is heavily doped with a P type dopant. Further shown in FIG. 1A, metal segments 110 and 112 are situated over respective source active regions 136 and 138 of FET 120 and provide an electrical connection to respective source active regions 136 and 138. Metal segments 110 and 112 can be situated in interconnect metal layer one (i.e. M1) of the semiconductor die and can comprise copper, aluminum, or other appropriate metal. Also shown in FIG. 1A, contacts 116 and 118 are situated in an interlayer dielectric layer (not shown in FIG. 1A), which is situated between source active regions 136 and 138 and respective metal segments 110 and 112. Contacts 116 and 118 provide electrical connections between source active regions 136 and 138 and respective metal segments 110 and 112 and 118 can comprise tungsten, copper, or other appropriate metal.

Further shown in FIG. 1A, metal segments 140, 142, and 144 are situated over drain active region 134 of FET 120. In the present embodiment, each of metal segments 140, 142, and 144 are aligned so as to extend in a direction perpendicular to gate fingers 130 and 132. In other embodiments, metal segments 140, 142, and 144 may each form an angle other than 90.0 degrees with respect to gate fingers 130 and 132. Metal segments 140, 142, and 144 can be situated in interconnect metal layer one of the semiconductor die (i.e. M1) and can comprise copper, aluminum, or other appropriate metal. Also shown in FIG. 1A, contacts 146, 148, and 150 are situated in an interlayer dielectric layer (not shown in FIG. 1A) and situated between drain active region 134 and respective metal segments 140, 142, and 144. Contacts 146, 148, and 150 provide an electrical connection between connect drain active region 134 of FET 120 and respective metal segments 140, 142, and 144 and can comprise tungsten, copper, or other appropriate metal. Contacts 146, 148, and 150 may each have a resistance of between approximately 5.0 ohms and approximately 10.0 ohms, for example.

Further shown in FIG. 1A, vias 152, 154, and 156 are situated in an interlayer dielectric layer (not shown in FIG. 1A) and situated between respective metal segments 140, 142, and 144 and metal segment 114. In the present embodiment, vias 152, 154, and 156 are situated over and in approximate alignment with respective contacts 146, 148, and 150 in a direction perpendicular to a top surface of substrate 102. In other embodiments, vias 152, 154, and 156 may not be in approximate alignment with respective contacts 146, 148, and 150. For example, vias 152, 154, and 156 may be situated over one end of metal segments 140, 142, and 144 and contacts 146, 148, and 150 may be situated under an opposite end of metal segments 140, 142, and 144, respectively.

Vias 152, 154, and 156 provide an electrical connection between respective metal segments 140, 142, and 144 and metal segment 114 and can comprise tungsten, copper, or other appropriate metal. Vias 152, 154, and 156 may each have a resistance of between approximately 5.0 ohms and approximately 10.0 ohms, for example. Also shown in FIG. 1A, metal segment 114 can be situated in interconnect metal layer two (i.e. M2) of the semiconductor die and can comprise copper, aluminum, or other appropriate metal. Metal segment 114 can be connected to a semiconductor die power bus (not shown in FIG. 1A) or to a signal pad (not shown in FIG. 1A) situated on the semiconductor die, for example. Further shown in FIG. 1A, isolation regions 104 and 106 are situated in substrate 102 and enclosed by (i.e. surrounded by) drain active region 134. Isolation region 104 is also situated between contact-via chains 122 and 124 and isolation region 106 is also situated between contact-via chains 124 and 126. Isolation regions 104 and 106 can comprise shallow trench isolation (STI) regions, for example. In other embodiments, isolation regions 104 and 106 may comprise local oxidation of silicon (LOCOS) or other appropriate isolation material.

As shown in FIG. 1A, contact-via chains 122, 124, and 126, which comprise contacts 146, 148, and 150, metal segments 140, 142, and 144, and vias 152, 154, and 156, respectively, are situated between gate fingers 130 and 132 and situated in a column that extends along the width of gate fingers 130 and 132. In the present embodiment, the number of contact-via chains, such as contact-via chains 122, 124, and 126, that can be provided along the width of gate fingers 130 and 132 is determined by width 133 of gate fingers 130 and 132 and by minimum design rule specifications. Contact-via chains 122, 124, and 126 are each electrically connected between drain active region 134 of FET 120 and metal segment 114. In one embodiment, contact-via chains, such as contact-via chains 122, 124, and 126, can be connected between one or more source active regions of FET 120 and a metal segment situated in interconnect metal layer two of the semiconductor die. In another embodiment, contact-via chains, such as contact-via chains 122, 124, and 126, can be connected between one or more source active regions and the drain active region of FET 120 and a metal segment situated in interconnect metal layer two of the semiconductor die. Contact-via chains 122, 124, and 126 can each have a resistance of approximately 10.0 ohms, for example. However, contact-via chains 122, 124, and 126 may also each have a resistance that is less than or greater than 10.0 ohms.

In the present invention, contact-via chains 122, 124, and 126 form local ballast resistors to provide increased ESD current distribution uniformity during an ESD event and, thereby, effectively increase the ESD protection provided by ESD protection structure 108. Metal segments 140, 142, and 144 in respective contact-via chains 122, 124, and 126 provide heat sinks for heat dissipation during the ESD event.

Figure 1B:
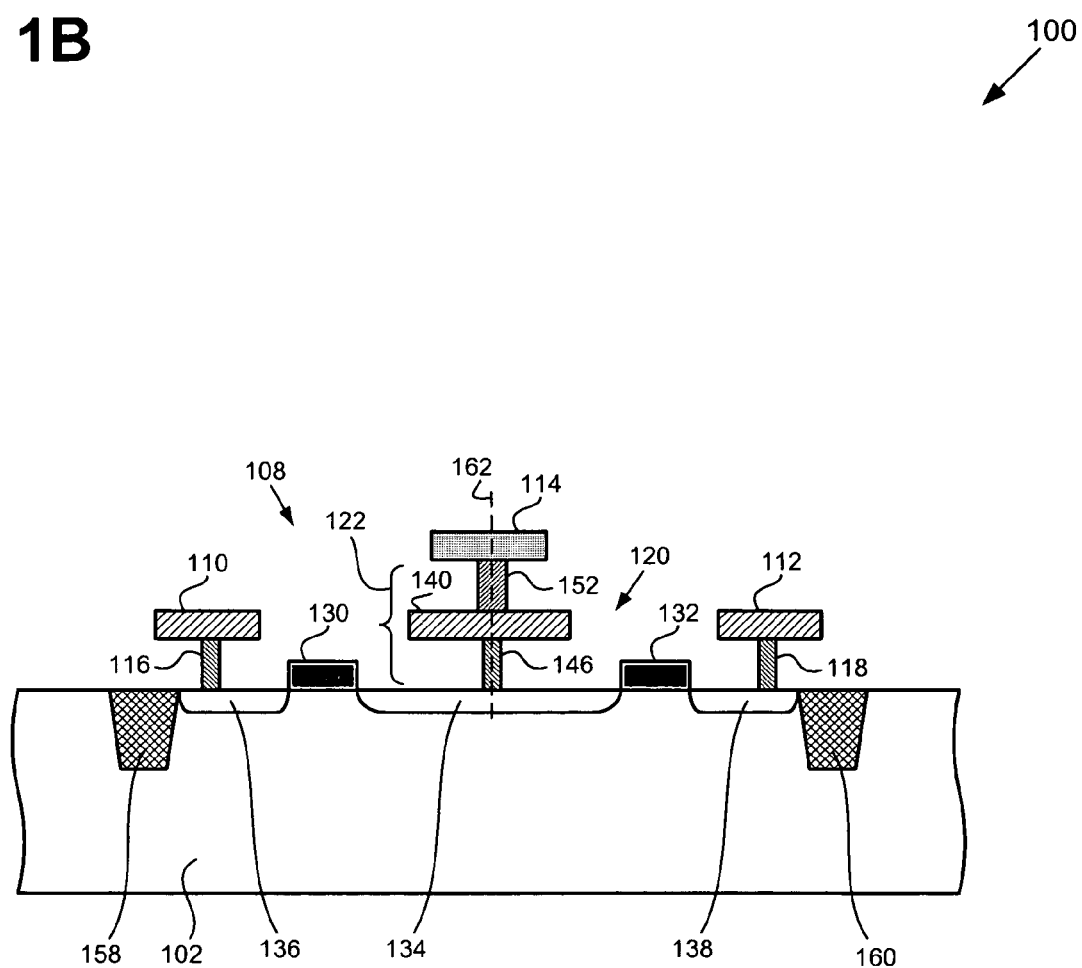
FIG. 1B illustrates a cross sectional view of the exemplary structure in FIG. 1A.

FIG. 1B shows a cross-sectional view of structure 100 in FIG. 1A along line 1B-1B in FIG. 1A. In particular, substrate 102, ESD protection structure 108, metal segments 110, 112, 114, and 140, contacts 116, 118, and 146, FET 120, contact-via chain 122, gate fingers 130 and 132, drain active region 134, source active regions 136 and 138, and via 152 correspond to the same elements in FIG. 1A and FIG. 1B. As shown in FIG. 1B, drain active region 134 is situated between source active regions 136 and 138 in substrate 102. Also shown in FIG. 1B, isolation regions 158 and 160 are situated in substrate 102 adjacent to respective source active regions 136 and 138. Isolation regions 158 and 160 can be STI regions, for example, and can comprise silicon oxide.

Further shown in FIG. 1B, gate finger 130 is situated between source active region 136 and drain active region 134 and gate finger 132 is situated between drain active region 134 and source active region 138. Also shown in FIG. 1B, contacts 116 and 118 are situated between source active regions 136 and 138 and metal segments 110 and 112, respectively. Further shown in FIG. 1B, contact-via chain 122, which comprises contact 146, metal segment 140, and via 152, is situated between drain active region 134 and metal segment 114. In particular, contact 146 is situated in a first interlayer dielectric layer (not shown in FIG. 1B) and situated on drain active region 134, metal segment 140 is situated on contact 146 and situated in interconnect metal layer one of the semiconductor die, and via 152 is situated in a second interlayer dielectric layer (not shown in FIG. 1B) and situated on metal segment 140.

In the present embodiment, via 152 is aligned over contact 146 such that the respective centers of via 152 and contact 146 are situated approximately on dashed line 162. In other embodiments, via 152 may be misaligned with respect to contact 146. By way of example, contact 146 may be situated under one end of metal segment 140 and via 152 may be situated over an opposite end of metal segment 140. Also shown in FIG. 1B, metal segment 114 is situated on via 152 and situated in interconnect metal layer two of the semiconductor die. Thus, contact-via chain 122, which is used as a ballast resistor in ESD protection structure 108, is electrically connected between drain active region 134 of FET 120 and metal segment 114.

Thus, as discussed above, the present invention provides an ESD protection structure including a FET using contact-via chains, such as contact-via chains 122, 124, and 126, as ballast resistors. By using contact-via chains as ballast resistors, the present invention provides ballast resistors that are fabricated without undesirably increasing layout area. In contrast, conventional ESD protection structures that utilize a salicide block active ballast resistor, a segmented active strip ballast resistor, or an N well ballast resistor require increased layout area, which undesirably increases drain-to-bulk and/or source-to-bulk parasitic capacitance and, thereby, degrades device high frequency performance. Thus, by providing ballast resistors comprising contact-via chains, the present invention achieves an ESD protection structure that advantageously provides lower drain-to-bulk and/or source-to-bulk parasitic capacitance and, therefore, increased high frequency performance compared to conventional ESD protection structure having ballast resistors that undesirably require increased layout area.

Also, the present invention's ESD protection structure can advantageously achieve an "It2" that is substantially higher than an "It2" achieved by a multi-finger FET that does not have ballast resistors. By way of background, "It2" is a figure of merit used to describe the ESD performance of an ESD structure and represents drain current at a second breakdown point as measured in a configuration in which the gate, source, and bulk of the FET are shorted together and drain voltage is ramped up. Additionally, the present invention's ESD protection structure can advantageously achieve substantially lower drain leakage current compared to an ESD protection structure including a multi-finger FET with an N well as a ballast resistor.

Furthermore, by providing an appropriate number of contact-via chains as ballast resistors, the present invention's ESD protection structure advantageously achieves increased ESD current distribution uniformity during an ESD event while advantageously avoiding the problems of increased drain-to-bulk and/or source-to-bulk parasitic capacitance and degradation in high frequency performance caused by forming ballast resistors that increase layout area.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, an ESD protection structure using contact-via chains as ballast resistors has been described.

The invention claimed is:

1. An ESD protection FET situated in a semiconductor die, said ESD protection FET comprising:
    a gate, a first active region, and a second active region, said gate comprising at least one gate finger, said at least one gate finger being situated between said first active region and said second active region;
    at least one contact-via chain in series with said first active region, said at least one contact-via chain comprising a contact in series with a via, said contact being connected to said via by a first metal segment;
    at least one isolation region situated adjacent to said at least one contact-via chain, said at least one isolation region being surrounded by said first active region;
    wherein said first metal segment connects said contact only to said via, wherein said at least one contact-via chain forms a ballast resistor for increased ESD current distribution uniformity.

2. The ESD protection FET of claim 1 wherein said first metal segment is situated in a first interconnect metal layer of said semiconductor die.

3. The ESD protection FET of claim 2 wherein said at least one contact-via chain is connected between said first active region and a second metal segment, wherein said second metal segment is situated in a second interconnect metal layer of said semiconductor die.

4. The ESD protection FET of claim 1 wherein said first active region is a drain active region.

5. The ESD protection FET of claim 1 wherein said first active region is a source active region.

6. The ESD protection FET of claim 2 wherein said at least one contact-via chain comprises a plurality of contact-via chains, wherein each of said plurality of contact-via chains is connected between said first active region and said second metal segment.

7. The ESD protection FET of claim 6 wherein said at least one isolation region is situated between two of said plurality of contact-via chains.

8. The ESD protection FET of claim 1 wherein said via is situated over and in approximate alignment with said contact.

9. The ESD protection FET of claim 1 wherein said at least one contact-via chain has a resistance of approximately 10.0 ohms.

10. The ESD protection FET of claim 1 wherein said at least one gate finger comprises a first gate finger and a second gate finger, wherein said first active region is situated between said first gate finger and said gate second finger.

11. An ESD protection FET situated in a semiconductor die, said ESD protection FET comprising:
   a gate, a first active region, and a second active region, said gate comprising a plurality of gate fingers, one of said plurality of gate fingers being situated between said first active region and said second active region;
   a plurality of contact-via chains in series with said first active region, each of said plurality of contact-via chains comprising a contact, a first metal segment, and a via, said first metal segment being connected between said contact and said via, said first metal segment being situated in a first interconnect metal layer of said semiconductor die;
   a plurality of isolation regions surrounded by said first active region, each of said plurality of isolation regions being situated adjacent to at least one of said plurality of contact-via chains;
   wherein said first metal segment connects said contact only to said via, wherein said each of said plurality of contact-via chains forms a ballast resistor for increased ESD current distribution uniformity.

12. The ESD protection FET of claim 11 wherein said each of said plurality of contact-via chains is connected between said first active region and a second metal segment, wherein said second metal segment is situated in a second interconnect metal layer of said semiconductor die.

13. The ESD protection FET of claim 12 wherein said first active region is a drain active region of said FET.

14. The ESD protection FET of claim 12 wherein said first active region is a source active region of said FET.

15. The ESD protection FET of claim 11 wherein said via is situated over and in approximate alignment with said contact.

16. The ESD protection FET of claim 11 wherein said each of said plurality of contact-via chains has a resistance of approximately 10.0 ohms.

17. The ESD protection FET of claim 11 wherein said first metal segment is aligned perpendicular to each of said plurality of gate fingers.

18. The ESD protection FET of claim 11 wherein said FET is an NFET.

19. The ESD protection FET of claim 11 wherein said FET is a PFET.

* * * * *